United States Patent [19]

Hockley et al.

[11] Patent Number: 4,665,504

[45] Date of Patent: May 12, 1987

[54] MEMORY DEVICE CONTAINING ELECTRICALLY CONDUCTING SUBSTRATE HAVING DEPOSITED HEREON A LAYER OF AMORPHOUS OR MICROCRYSTALLINE SILICON-CARBON ALLOY AND A LAYER OF AMORPHOUS OR MICROCRYSTALLINE SILICON-CONTAINING MATERIAL

[75] Inventors: Peter J. Hockley, Hook, near Basingstoke; Michael J. Thwaites, Hook, both of England

[73] Assignee: The British Petroleum Company, London, England

[21] Appl. No.: 552,427

[22] Filed: Nov. 16, 1983

[30] Foreign Application Priority Data

Nov. 26, 1982 [GB] United Kingdom ............... 8233764

[51] Int. Cl.⁴ ...................... G11C 11/42; G11C 13/00
[52] U.S. Cl. ........................................ 365/163; 357/2; 357/59; 365/184
[58] Field of Search ...................... 357/2, 59; 365/163, 365/184

[56] References Cited

U.S. PATENT DOCUMENTS

| 3,600,645 | 8/1971 | Berman | 357/71 |
| 3,740,620 | 6/1973 | Agusta et al. | 357/16 |
| 4,103,312 | 7/1978 | Chang et al. | 357/114 |
| 4,199,692 | 4/1980 | Neale | 307/238 |
| 4,459,163 | 7/1984 | MacDiarmid et al. | 148/174 |

FOREIGN PATENT DOCUMENTS 1300528 12/1972 United Kingdom .

Primary Examiner—Terrell W. Fears
Attorney, Agent, or Firm—Morgan & Finnegan

[57] ABSTRACT

A memory device comprises an electrically conducting substrate having deposited thereon a layer of an amorphous or microcrystalline silicon-carbon alloy and a layer of amorphous or microcrystalline silicon-containing material to form a junction. Preferably the silicon-containing material is silicon and the junction is a heterojunction.

The device has fast switching characteristics and good stability.

6 Claims, 3 Drawing Figures

MEMORY DEVICE CONTAINING ELECTRICALLY CONDUCTING SUBSTRATE HAVING DEPOSITED HEREON A LAYER OF AMORPHOUS OR MICROCRYSTALLINE SILICON-CARBON ALLOY AND A LAYER OF AMORPHOUS OR MICROCRYSTALLINE SILICON-CONTAINING MATERIAL

This invention relates to a memory device of novel structure incorporating an amorphous or microcrystalline silicon-carbon alloy.

IEE Proc., Vol 129, Pt I, Solid State and Electron Devices, No 2, April, 1982, pages 51-54 discloses an electrically programmable non-volatile semiconductor memory device. In its simplest form this contains p and n layers of amorphous silicon deposited onto a conducting stainless steel substrate. The layered structure is conditioned into a memory device by applying a large forward bias of known polarity which switches the structure into a stable ON state. This step is known as "forming" and permanently modifies the electrical properties of the device. The forming voltage is approximately 20 to 25 volts. After forming the device can then be switched to the alternative OFF state by applying a voltage pulse above a low threshold such as 1 V with opposite polarity to the original pulse. The OFF state is stable for voltage swings of approximately ±4–5 V beyond which it switches to the ON state, i.e. the forward threshold voltage $V_{ThF}$ is $\simeq$4-5 V. The ON state is stable for voltage swings of ±1 volt beyond which it switches to the OFF state i.e. the reverse threshold voltage $V_{ThF}$ is $\simeq$1 V. Switching times are remarkably fast, being less than 100 ns.

If desired, the device can be formed in the OFF state by initially applying a reverse bias.

Our copending European patent application No 83302665 discloses a memory device comprising an electrically conducting substrate and layers of i and p and/or n type amorphous or microcrystalline semi-conducting material which have been conditioned by the application of a voltage sufficiently large to cause the structure to be permanently modified to reduce the electrical resistance of the layers wherein no p and n layers are adjacent in the device.

We have now surprisingly discovered that memory devices based on various configurations of amorphous or micro-crystalline silicon-carbon alloys and amorphous or microcrystalline silicon possess improved switching characteristics leading to more stable devices.

According to the present invention there is provided a memory device, conditioned by the application of a voltage to a layered semiconductor structure, the memory device comprising an electrically conducting substrate having deposited thereon a layer of an amorphous or microcrystalline silicon-carbon alloy and a layer of an amorphous or microcrystalline silicon-containing material to form a junction.

Preferably the layer of amorphous or microcrystalline silicon-containing material is amorphous or microcrystalline silicon and forms a heterojunction with the layer of amorphous or microcrystalline silicon carbon alloy.

Alternatively, the layer of amorphous or microcrystalline silicon-containing material may be an amorphous or microcrystalline siliconcarbon alloy and form a homojunction with the first layer of amorphous or microcrystalline silicon-carbon alloy.

Suitable structures include layers having the configuration p—i, p+i, p—n, p+n, and p—n+. A further layer of amorphous or microcrystalline silicon or silicon carbon alloy can be added to p—n structures to give a p—i—n or p—n—i type structure.

Preferably the p-type layer is formed from the amorphous or microcrystalline silicon alloy and the n-type layer is formed from amorphous or microcrystalline silicon.

Layers of i— silicon can be made by methods known in the art, for example by decomposing silane by glow discharge. Layers of p and p+ or n and n+ silicon can be made by adding diborane or phosphine respectively in varying quantities to the silane. Layers of doped or undoped silicon carbon alloys can be prepared by adding methane to the appropriate silane mixture.

The silane and other decomposable gas if present can be in admixture with hydrogen and the total pressure controlled to obtain amorphous silicon.

In the case of silane/hydrogen mixtures the concentrations are preferably lower than those which are spontaneously combustible in air, eg about 5% by volume silane.

Glass having an electrically conducting surface of tin oxide or indium tin oxide or other visible or ultra violet light permeable electrically conducting material is a convenient substrate. With such a substrate, the memory device can be influenced by light.

Alternatively the substrate can be similarly treated quartz.

Desirably the device includes one or more electrically conducting areas on the outer surface of the silicon layer remote from the glass. These areas can conveniently be provided by zones of a metal such as aluminium.

The device comprising substrate and layers of amorphous or microcrystalline silicon-carbon alloy and amorphous or microcrystalline silicon is conditioned to a memory device by applying a voltage sufficiently large to cause the device to be capable of being put into a stable state by a voltage of known polarity and reversed by a voltage of opposite polarity.

The invention is illustrated by the following Example.

EXAMPLE 1

An ITO (indium tin oxide) coated glass substrate was placed face downwards on a temperature variable substrate holder, the whole being inside a cylindrical Pyrex or heat-resistant siliceous glass reaction chamber. The chamber was evacuated to $10^{-2}$ torr with a trapped rotary pump and the substrate heated to 270° C. A mixture containing 2.4% by volume silane, 1.6% methane and 96% hydrogen was admitted to the chamber to bring the pressure up to about 3 torr. Once the pressure had stabilised a small amount of diborane was added to the silane in the chamber. A glow discharge was initiated by exciting external coils encircling the Pyrex vessel from a LFE radio frequency generator operating at 13.56 M Hz. This caused a p-type amorphous silicon carbon alloy to be deposited on the ITO coated glass from the gas phase. After one minute the diborane and methane flows were terminated, thus causing a region of intrinsic (or undoped) material to be produced on top of the p-type region. This situation was maintained for 30 minutes. Finally, phosphine was progressively admitted to the reaction chamber and growth continued for a further six minutes. At this stage the discharge was extinguished, the phosphine flow was stopped and the device was allowed to cool under a flow of 4% silane in hydrogen. When the device had cooled to room temperature it was removed from the reaction chamber and placed in a vacuum coater, where several dots (2 mm diameter) of aluminum were evaporated onto the surface of the device.

Figure 1:
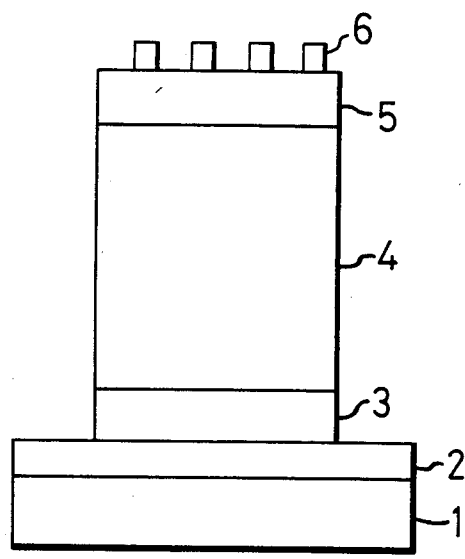
FIG. 1 illustrates an embodiment of the invention mode of a substrate with deposited layers to provide a memory device.

The complete structure is shown in FIG. 1 wherein 1 represents the glass substrate, 2 the layer of ITO, 3 the layer of p+ silicon-carbon alloy, 4 the layer of intrinsic silicon, 5 the layer of n+ material and 6 the aluminium dots. The thickness of p+ layer is about 200 Å, the n+ layer about 500 Å and the i layer about 4300 Å.

Figure 2:
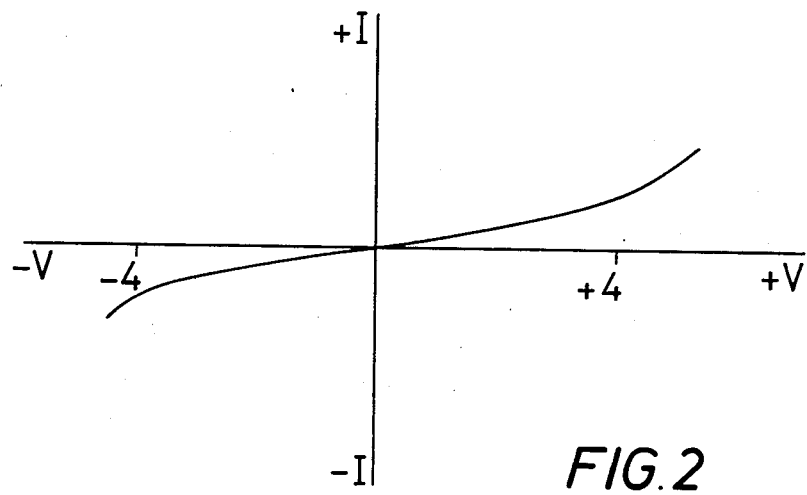
FIG. 2 illustrate the initial voltage-current characteristics of the device.

The device was placed on a curve tracer and its voltage/current characteristics examined. Initially they were of the form as shown in FIG. 2. A large voltage (10-20 V) was then applied to the device. This step 'conditions' the device into a memory (switching) device with the characteristics as shown in FIG. 3.

Figure 3:
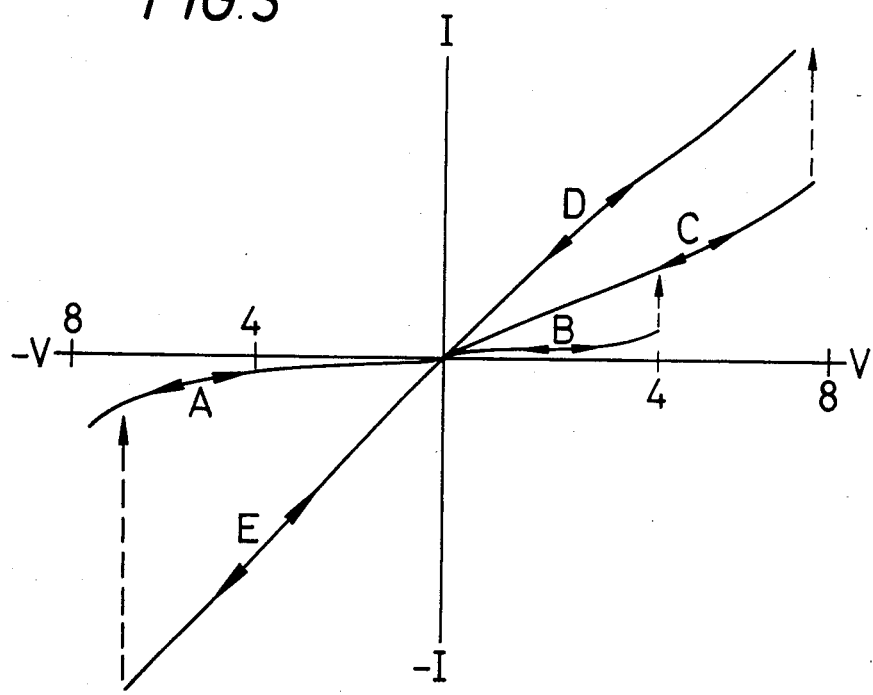
FIG. 3 illustrates the voltage current characteristics of the memory device after conditioning by a 10-20 volt pulse.

Curves A and B in FIG. 3 show the device in its OFF state. Applying negative bias (curve A) has no effect on the conductivity state, applying forward bias (curve B) causes the device to switch to an intermediate conductivity state (curve C) at above 4 V. Further forward bias finally switches the device to its ON state, (curve D). Higher forward potentials have no further effect on the conductivity state. Applying negative bias now leaves the device in the ON state (curve E) until a potential of 7 V is attained, whereupon it immediately switches to its OFF state (curve A). This sequence of events is repeatable with no change in the ON-OFF conductivity or switching levels.

The device retains the fast switching time (less than 100 ns) and low associated power requirements of a memory deviced based on an amorphous or microcrystalline silicon homojunction, when compared with previous non-volatile memory devices based on chalcogenides.

In addition, the presence of the layer of silicon-carbon alloy increases the ON-OFF and OFF-ON switching thresholds by about 2 V over those in a homojunction switch. This renders the heterojunction device more stable, possibly as a result of its increased immunity to electrical noise.

We claim:

1. A memory device conditioned by the application of a voltage sufficiently large to permanently modify the electrical characteristics to a layered semiconductor structure, the memory device comprising an electrically conducting substrate having deposited thereon a layer of an amorphous or microcrystalline silicon-carbon alloy and a layer of amorphous or microcrystalline silicon-containing material to form a junction.

2. A memory device according to claim 1 wherein the layer of amorphous or microcrystalline silicon-containing material is amorphous or microcrystalline silicon and forms a heterojunction with the layer of silicon-carbon alloy.

3. A memory device according to claim 1 wherein the layer of amorphous or microcrystalline silicon-containing material is also a layer of a silicon-carbon alloy and forms a homojunction with the first layer of silicon-carbon alloy.

4. A memory device according to claim 1 wherein the layers have the configuration p—i, p+—i, p—n, p+—n, or p—n+.

5. A memory device according to claim 1 wherein at least three layers are present having a p—i—n or p—n—i type configuration.

6. A memory device, conditioned by the application of a voltage sufficiently large to permanently modify the electrical characteristics to a layered semiconductor structure, the memory device comprising an electrically conducting substrate having deposited thereon a p-type layer of an amorphous or microcrystalline silicon-carbon alloy and an n-type layer of amorphous or microcrystalline silicon to form a heterojunction.

* * * * *